United States Patent [19]

Kleinknecht et al.

[11] Patent Number: 4,964,726
[45] Date of Patent: Oct. 23, 1990

[54] APPARATUS AND METHOD FOR OPTICAL DIMENSION MEASUREMENT USING INTERFERENCE OF SCATTERED ELECTROMAGNETIC ENERGY

[75] Inventors: Hans P. Kleinknecht, Bergdietikon; Karl H. Knop, Zurich, both of Switzerland

[73] Assignee: General Electric Company, Somerville, N.J.

[21] Appl. No.: 250,249

[22] Filed: Sep. 27, 1988

[51] Int. Cl.$^5$ ............................................. G01B 9/02
[52] U.S. Cl. ...................................... 356/357; 356/355
[58] Field of Search .............. 356/355, 356, 357, 358, 356/353, 384, 445, 446

[56] References Cited

U.S. PATENT DOCUMENTS 4,039,370  8/1977  Kleinknecht .
4,141,780  2/1979  Kleinknecht et al. .
4,200,396  8/1980  Kleinknecht et al. .
4,303,341  12/1981  Kleinknecht et al. .
4,330,213  5/1982  Kleinknecht et al. .
4,408,884  10/1983  Kleinknecht et al. .

4,690,565  9/1987  Kato et al. ......................... 356/384

OTHER PUBLICATIONS

Sheppard et al., "Image Formation in the Scanning Microscope", *Optica Acta*, vol. 24, No. 10, pp. 1051–1073, 1977.

*Primary Examiner*—Vincent P. McGraw
*Assistant Examiner*—S. A. Turner
*Attorney, Agent, or Firm*—K. R. Glick

[57] ABSTRACT

A dimension of an object disposed on a substrate, such as the width of a line of material deposited on a substrate in an integrated circuit manufacturing procedure, is measured by directing a plane wave of electromagnetic energy of predetermined dimensions toward the object at a predetermined angle of incidence. Electromagnetic energy scattered from two predetermined parts or features, such as the edges, of the object are combined so that they produce an interference pattern in space varying between maxima and minima. The characteristics of the interference pattern permit the dimension of the object to be deduced.

56 Claims, 6 Drawing Sheets

APPARATUS AND METHOD FOR OPTICAL DIMENSION MEASUREMENT USING INTERFERENCE OF SCATTERED ELECTROMAGNETIC ENERGY

FIELD OF THE INVENTION

This invention relates to the field of optical dimension measuring. More particularly, this invention relates to an apparatus for optically measuring a dimension of an object, such as the width of a strip or line of material disposed on a substrate. The invention also relates to a method of performing such a measurement. The apparatus and method of the invention are particularly useful in measuring lines less than one micron wide formed on wafers in accordance with very large scale integration (VLSI) procedures.

BACKGROUND OF THE INVENTION

The manufacture of integrated circuits includes processing steps resulting in the formation of geometrical patterns of material on a substrate. An example of such a pattern is a photoresist mask formed on the substrate by a photolithographic process. These patterns typically comprise a plurality of very narrow strips or lines of material disposed on a substrate.

There has been a constantly increasing demand for smaller electronic equipment which, of course, requires smaller electronic circuitry, particularly, very small integrated circuits. This has resulted in a need for ever smaller structures to be fabricated on substrates, such as semiconductor wafers, so that more circuitry can be packed into a given space. In recent years, as a result of the desire for smaller integrated circuits, manufacturing techniques have been developed which are capable of producing structures on substrates having dimensions of less than 1 micron, for example, lines of material that are less than one micron wide. The dimensions of these structures are critical parameters which must be monitored and controlled at various stages of the manufacturing process if very small, high density integrated circuits are to be successfully produced.

In the past, line width measurement in integrated circuits has been performed using standard optical microscopes. However, the resolution of such microscopes is limited by the wavelength of the light employed and the aperture of the objective lens in the microscope. Because of the wavelength of visible light and the nature of objective lenses, it is difficult to reliably measure dimensions smaller than about one micron. The resolution of such microscopes has been extended somewhat by using shorter wavelength light, such as blue or ultraviolet light, or by using lenses with extremely high numerical apertures, such as water-immersion lenses. An increase in resolution of about 1.4 times may be achieved by using the confocal optical scanning microscope concept. This concept is referred to in an article by C. J. R. Sheppard and A. Choudhury, entitled "Image formation in the scanning microscope", appearing in *Optica Acta*, 1977, Vol. 24, No. 10, pp. 1051–1073. There is, however, a limit to what may be achieved in terms of resolution with optical microscopes. The limitations are such that even the techniques for extending resolution do not result in sufficient accuracy for measuring the very narrow line widths required in many of today's integrated circuits.

To overcome the limitations of measurements made with optical microscopes, scanning electron microscopes have been developed which will accurately measure the width of the narrowest line capable of being made using present day integrated circuit manufacturing technology. However, the expense and complexity of such electron microscopes makes their use impractical in an integrated circuit production environment. Specifically, these electron microscopes make it difficult to achieve high throughput in a production environment. Thus, they have been used only to calibrate optical measuring apparatus capable of such high throughput.

Another technique for measuring line widths is described in Kleinknecht et al. U.S. Pat. Nos. 4,200,396 and 4,303,341. See also Kleinknecht et al. U.S. Pat. Nos. 4,039,370, 4,141,780, 4,330,213, and 4,408,884. The technique involves indirectly measuring line width by observing the characteristics of a diffraction grating formed on a test surface adjacent an integrated circuit pattern, both the grating and the circuit pattern being formed on the same semiconductor wafer. In this technique, material is simultaneously removed from the circuit area of the semiconductor wafer and the adjacent test surface to form an integrated circuit pattern and a diffraction grating on the same wafer. The average width of a series of strips in the diffraction grating is measured by exposing the entire diffraction grating to a beam of monochromatic light. The diffraction grating diffracts the light beam into a plurality of beams of different orders. The intensities of the first and second order diffracted beams, referred to by the patents as I1 and I2, are measured by photodetectors placed at appropriate diffraction angles. The average width of the strips making up the entire diffraction grating is calculated as a function of the ratio I2/I1. This average width of the strips in the diffraction grating is then taken as the width of the lines in the integrated circuit pattern adjacent the diffraction grating.

Although this technique is capable of optically determining the width of lines disposed on substrates in an integrated circuit manufacturing process, it does not directly measure the actual width of any of those lines in the integrated circuit pattern. The accuracy of line width values inferred from the average strip width in the diffraction grating accordingly may be limited for very small line widths.

As a consequence of the difficulty of accurately measuring small line widths, a long felt but unfulfilled need has existed for an apparatus and method which will directly and accurately measure the dimensions of an object disposed on a substrate, such as the width of a line in an integrated circuit pattern, which is practical in a commercial integrated circuit manufacturing environment.

SUMMARY OF THE INVENTION

The invention satisfies this need by providing an apparatus and method which is capable of measuring a dimension of an object having first and second points which define the dimension being measured. Electromagnetic energy is directed toward the object at a predetermined angle of incidence so that the electromagnetic energy is scattered from the first and second points of the object. The electromagnetic energy scattered from these points is detected in a manner which permits the dimension to be ascertained.

DETAILED DESCRIPTION

Figure 1:
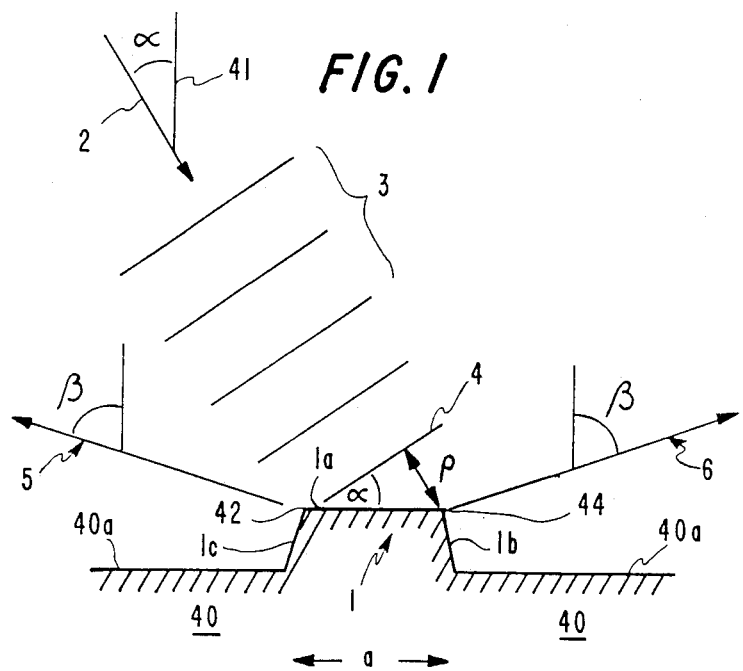
FIGS. 1 and 2 show cross sections of strips of material disposed on a substrate which illustrate the underlying principles of the invention of this application.

The principles on which the invention of this application is based are illustrated in FIG. 1. It shows the cross section of an object disposed on a flat substrate 40. The dimensions of the object are to be ascertained through the use of an apparatus and method in accordance with this invention.

The object comprises a strip or line of material 1 having a flat top surface 1a and two side surfaces 1b and 1c joined to the top surface at two relatively sharp corners 42 and 44. The line 1 may be part of a pattern of material deposited on the substrate in connection with a process of manufacturing integrated circuits. For example, line 1 may be a strip of photoresist formed on the top surface of a silicon wafer by generally known photolithographic techniques.

The dimension of line 1 which is to be measured by this example of the invention is the width of the line 1 labelled as "a" in FIG. 1 and defined by the horizontal distance from corner 42 to corner 44. As mentioned above, it is important that this width dimension be measured and controlled in an integrated circuit manufacturing process.

To measure the width of line 1, a beam of electromagnetic energy is directed toward the line in a direction indicated by arrow 2 in FIG. 1. As shown in FIG. 1, the beam of electromagnetic energy is directed toward the line at an angle of incidence "alpha" with respect to a line 41 which is normal to the horizontal top surface of line 1 and the horizontal top surface of the substrate 40. The electromagnetic energy beam is configured such that it is essentially a plane wave having a plurality of planar wave fronts 3. The beam is also configured so that it impinges on no more than a single line 1. The manner in which the incident beam of electromagnetic energy may be configured in this fashion is described in more detail below.

As is evident from the geometry of FIG. 1, plane wave 4, as well as all other plane waves 3, strike the top surface of line 1 at an angle of incidence "alpha". As illustrated in FIG. 1, a planar wave front 4 has advanced toward the top surface 1a of line 1 so that one end of wave front 4 is striking corner 42. Because of the angle of incidence, both ends of each wave front do not strike the corners of line 1 at the same time. Electromagnetic energy scattered from one of the corners thus will be shifted in phase with respect to electromagnetic energy scattered from the other corner because the length of the path travelled by the electromagnetic energy scattered from one of the corners is different from the length of the path travelled by the electromagnetic energy scattered from the other corner. This path length difference depends on the angle of incidence and the width of line 1.

The width of line 1 may be ascertained by determining the angle of incidence and the difference in path length of the electromagnetic energy scattered from the corners 42 and 44 and computing the width from a previously ascertained geometrical relationship existing between path length difference, width, and incidence angle. In practice, the path length difference can be obtained by combining the electromagnetic energy scattered from the two corners of line 1 so that the electromagnetic energy interferes to produce an interference pattern. As explained below, selected characteristics of this interference pattern may be examined to ascertain the path length difference. And, by also measuring the angle of incidence, one can calculate the width of line 1.

In general, the incident beam of electromagnetic energy is reflected from a reflective surface of line 1, such as the top surface 1a, at an angle of reflection equal to the angle of incidence. For the case of incident electromagnetic energy striking the top surface of the line in FIG. 1, the angle of reflection is equal to "alpha". At the corners 42 and 44, however, the electromagnetic energy is not reflected at an angle "alpha", but is scattered from the corners at a wide range of angles. Arrows 5 and 6 in FIG. 1 represent two of the directions in which a part of the electromagnetic energy is scattered from corners 42 and 44. Electromagnetic energy scattered in these directions may be combined to produce an interference pattern from which the width of line 1 may be ascertained. These directions are at an angle "beta" with respect to the normal line 41. Angle "beta" is somewhat arbitrary and is selected so that it is greater than angle "alpha" and so that the dominant contribution to the electromagnetic energy flowing in the direction of arrow 5 comes from electromagnetic energy scattered from corner 42 and the dominant contribution to the electromagnetic energy flowing in the direction of arrow 6 comes from electromagnetic energy scattered from corner 44. As mentioned above, the electromagnetic energy scattered from corner 42 in the direction of arrow 5 is phase shifted with respect to the electromagnetic energy scattered from corner 44 in the direction of arrow 6 due to the fact that the length of the path traveled by the electromagnetic energy scattered from corner 44 is greater than the length of the path traveled by the electromagnetic energy scattered from corner 42. This path length difference is the distance "p" in FIG. 1. As more fully explained below, if the magnitudes of "p" and "alpha" and the geometrical relationship between "p", "alpha", and "a" are known, then the magnitude of the line width "a" may be ascertained.

For the geometry of FIG. 1, the relationship between the path length difference "p", the width "a" of line 1, and the angle of incidence "alpha" is given by the following equation:

$$p = a \sin(alpha) \tag{1}$$

In principle, if the angle of incidence and the path length difference are known, then the line width can be determined by solving equation (1) for "a".

Equation 1 is strictly correct within the range of validity of scalar electromagnetic theory and only for objects having cross sections with sharp corners, such as the line shown in FIG. 1. However, as described below with respect to FIG. 2, the principles of ascertaining line width from a path length difference and an angle of incidence can be extended to objects of any shape once the geometry of that shape is ascertained and the principles of electromagnetic energy scattering theory are applied to that geometry.

Figure 2:
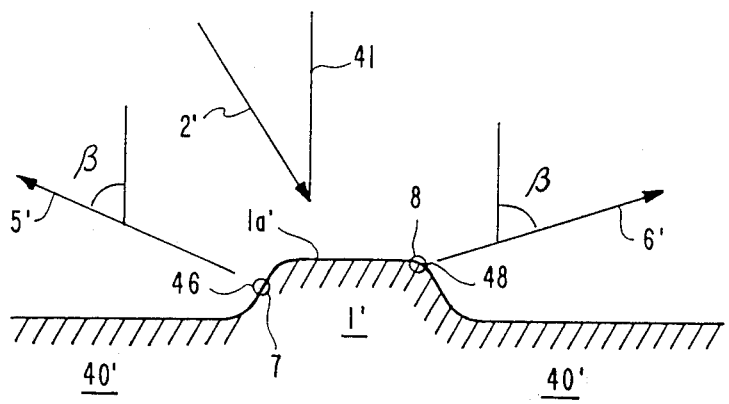

FIG. 2 shows a cross-section of another line 1, disposed on a substrate 40'. Line 1' has a flat top surface 1a' and rounded edges 46 and 48. A beam of electromagnetic energy is directed toward line 1' in a direction indicated by arrow 2'. As in FIG. 1, the incident beam of electromagnetic energy is in the form of a plane wave having an angle of incidence "alpha" with respect to a normal line 41. Also as in FIG. 1, electromagnetic energy is scattered from corners 46 and 48 in the direction of arrows 5' and 6' which are at an angle "beta" with respect to the normal line 41. Electromagnetic energy flowing in the direction of arrow 5' consists predominantly of electromagnetic energy scattered by edge 46 of line 1', with most of the electromagnetic energy scattered by edge 46 coming from point 7, a point of specular reflection on the side of the line 1'. Electromagnetic energy flowing in the direction of arrow 6' comprises predominantly electromagnetic energy scattered by edge 48 of line 1', with most of the electromagnetic energy scattered by edge 48 coming from point 8, another point of specular reflection.

As in the structure of FIG. 1, the electromagnetic energy scattered from line 1' in the directions of arrows 5' and 6' in FIG. 2 differ in phase due to a path length difference "p" resulting from the non-zero angle of incidence "alpha". For a line such as line 1', which does not have sharp corners, the relationship between the path length difference, the width of line 1', and the angle of incidence has the general form:

$$p = F(a, alpha) \quad (2)$$

where the function F depends on, and may be calculated from, the geometry of line 1'. For certain assumed line shapes, the theoretical function F, which is merely the expected mathematical relationship between the path length difference, the line width, and the angle of incidence for each assumed line shape, can be calculated using Huygens' principle, by considering all points on the surface of line 1' as point sources of electromagnetic energy, computing the intensity and distribution of electromagnetic energy at the point sources through the use of electromagnetic theory, and summing the contributions from all of the point sources to obtain the electromagnetic energy flowing in the directions of arrows 5' and 6'. For other assumed line shapes, the theoretical function F may be calculated using an exact electromagnetic theory, also known as vector theory. Examples of assumed line shapes for which a theoretical function F may be determined include those having rectangular cross sections with sharp corners, as in FIG. 1, those having rectangular cross sections with corners having varying degrees of rounding, as in FIG. 2, those having trapezoidal cross sections, those having triangular cross sections, and those having semicircular cross sections.

A theoretical function F can be calculated for each of a variety of assumed line shapes which might be encountered in an integrated circuit manufacturing process. Specifically, a set of curves relating path length difference to angle of incidence for each of a desired number of line widths may be produced, a set of such curves being calculated for each of the assumed line shapes. These calculations may be made by an appropriately programmed digital computer. (The techniques of applying the theories of electromagnetic energy scattering to assumed geometries are not described here because they are well known in the art of optics and are readily available in the open literature. See, for example, *Principles of Optics*, by M. Born and E. Wolf, Pergamon Press, 1965 edition. Techniques of programming a digital computer to perform the needed calculations in accordance with electromagnetic energy scattering theories are also well known and are readily achievable by those of ordinary skill in the art in light of the teachings in this application. Thus, they are not described in detail here.)

The correct function F, which is merely the actual mathematical relationship between the path length difference, the line width, and the angle of incidence in an actual sample of the structure to be measured, can be ascertained experimentally by determining the magnitude of the path length difference "p" at a plurality of incidence angles "alpha". Curve fitting techniques may be applied to this path length and incidence angle data to arrive at the correct function F, from which the correct line width "a" can be obtained. Specifically, this path length and incidence angle data taken from an actual sample of the structure being measured is compared with the theoretical functions F computed in light of the assumed line shapes, that is, the actual curves describing the relationship of path length difference to angle of incidence produced for the actual structure may be compared to the sets of curves computed for the assumed shapes. The set of computed curves having the most similar shapes to that of the measured curve may then be considered to represent an assumed line shape which is like that of the actual structure being measured. The curve in that set most like that of the measured curve indicates the line width of the measured structure. This curve fitting technique may be done manually or it may be done by an appropriately programmed digital computer, the programming of which is readily accomplished by a person of ordinary skill in the art in light of the teachings of this application and what is generally known in the art of curve fitting and computer programming.

The path length difference "p" can be determined by combining the electromagnetic energy scattered in the directions of arrows 5' and 6' using suitable optical elements, such as mirrors, beam splitters, and one or more lenses, and observing the characteristics of an interference pattern produced by the combination of the scattered electromagnetic energy. The angle of incidence then may be varied and the resulting changes in the interference pattern may be observed. As explained in more detail below, this procedure of changing the angle of incidence and observing changes in an interference pattern permits experimental determination of values for "p" and "alpha". Solving an equation like equation (2) or using the curve fitting techniques described above will yield the line width "a".

As an alternative to curve fitting with theoretical functions F, the apparatus of the invention may be used to measure lines of known width, such measurement producing a set of calibration data for each of the lines of known width. A line having an unknown width, fabricated in the same manner that the lines of known width were fabricated, is then measured, which produces a set of measurement data that may be compared with the sets of calibration data. The unknown width of the measured line is the same as that of the line of known width which produced the set of calibration data matching the set of measurement data.

Figure 3:
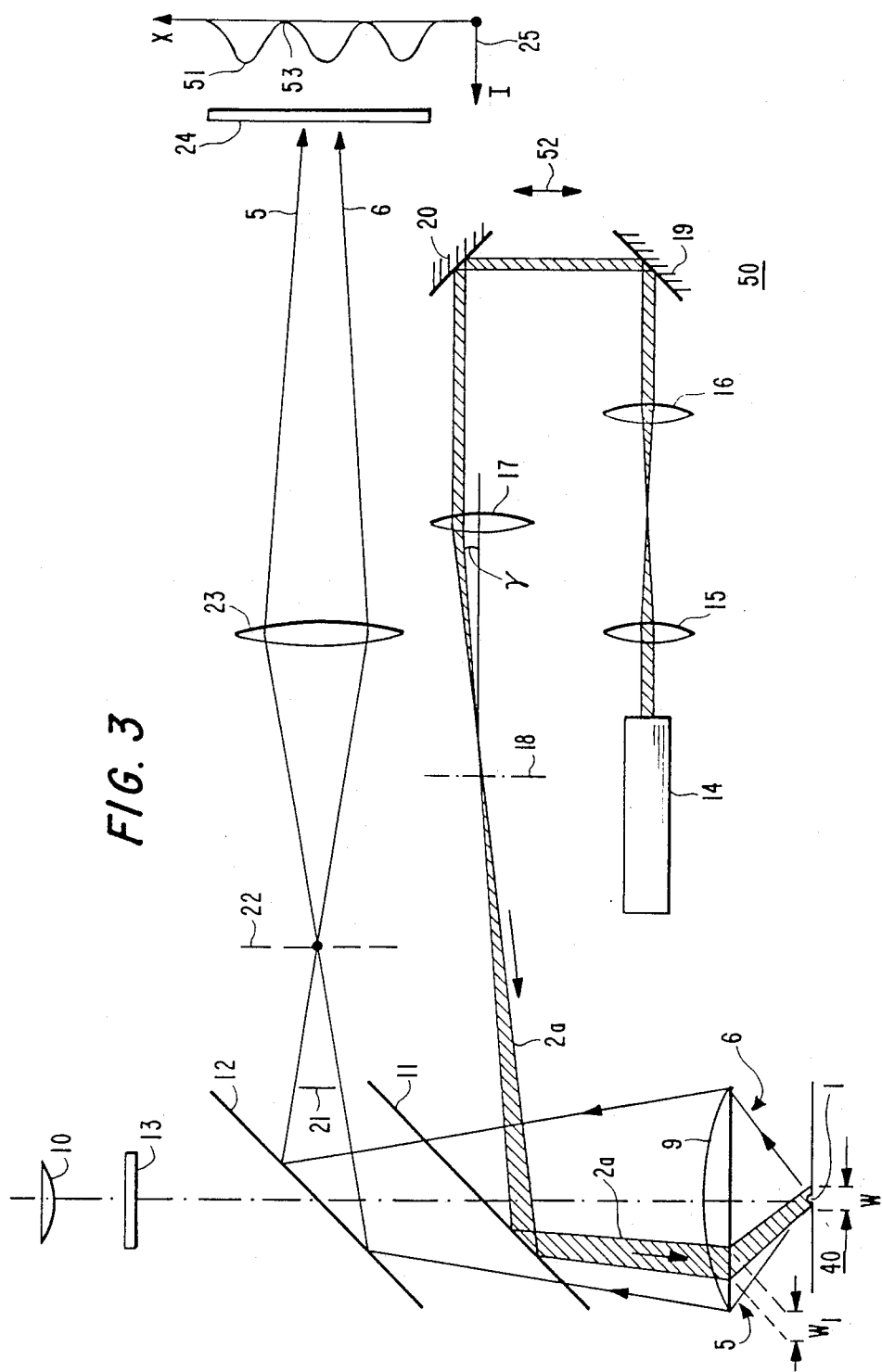
FIG. 3 is a schematic diagram of a first example of an optical measurement system in accordance with the invention of this application.
Figure 4:
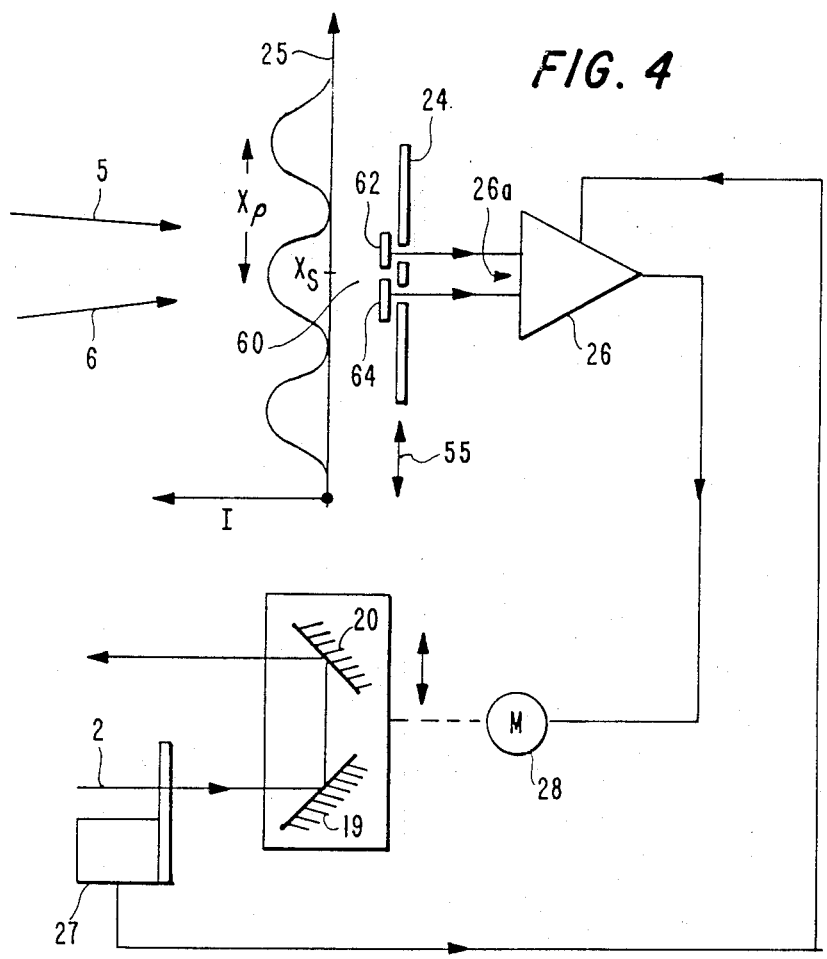
FIG. 4 is a schematic diagram of an example of a detector circuit and a control circuit useful in carrying out the example of the invention shown in FIG. 3.

A practical example of an apparatus and method for ascertaining line width, using the techniques outlined above, is illustrated in FIGS. 3 and 4. In this example, both the illumination of the line to be measured and the collection of electromagnetic energy scattered from the edges of the line which define its width may be accomplished by means of a single objective lens in an optical microscope. This arrangement not only permits line width to be measured, but it also permits an operator looking through the eyepiece of the microscope to visually inspect a substrate and thereby select a line to measure.

FIG. 3 shows an objective lens 9, which may be of 40X magnification with a numerical aperture of 0.85, and an eyepiece 10, which may have 10X magnification. The objective lens 9 and the eyepiece 10 are located in an optical microscope which permits an operator to visually observe substrate 40 and select for line width measurement a particular line 1 disposed on that substrate. A filter 13, which typically may be a Kodak brand gelatin filter, is inserted in front of the eyepiece 10 to prevent dangerous laser light from entering the operator's eye. A laser 14, preferably a red He-Ne laser, which may be a 10 milliwatt Hughes Model 3225H-PC laser, produces a monochromatic beam 2a of electromagnetic energy which is collimated and expanded by lenses 15 and 16, which may have focal lengths of about 20 mm. and 60 mm., respectively. Laser beam 2a is then reflected by mirrors 19 and 20 and focused by a lens 17, which may have a focal length of about 200 mm., onto a focal plane 18. A first beam splitter 11 reflects the laser beam 2a toward the objective lens 9 which directs it to the line 1 which is to be measured.

As shown in FIG. 3, lenses 15, 16, and 17 shape the laser beam 2a so that it fills only a small part of the aperture of the objective lens 9. These lenses permit the width of the laser beam 2a falling on the sample 1 to be made greater than the width of the line being measured, but they keep the beam narrow enough so that it illuminates not more than this one line. They also permit the laser laser beam 2a to be shaped into the approximate form of a series of plane waves of electromagnetic energy incident on line 1.

For a pure Gaussian laser beam, that is, a laser beam in which the intensity of electromagnetic energy decreases as a function of distance from the axis of the beam in accordance with a Gaussian function, the width, "W", of the laser beam falling on the sample 1 is related to the wavelength, "lambda", of the laser beam 2a, the focal length, "f", of the objective lens 9, and the width, "$W_1$", of the laser beam 2a in the plane of the objective lens 9, in accordance with the following equation:

$$W = (1.273) \times (lambda) \times (f/W_1). \tag{3}$$

In equation (3), W and $W_1$ are the distances from the axis of the laser beam at which the intensity of the electromagnetic energy is lower, by a factor of $1/e^2$ or 1/7.39, than the intensity of the electromagnetic energy on the axis of the laser beam. The electromagnetic energy in the laser beam 2a will be a good approximation of a plane wave as it strikes line 1 if the beam width "W" is at least three times the line width. Hence, for a 1 micron line, "W" must be at least 3 microns. According to equation (3), for a He-Ne laser producing a beam of electromagnetic energy having a wavelength "lambda" of 0.6328 microns and a 40X lens 9 having a focal length "f" of 3.9 mm, "$W_1$" must be 1.05 mm. The width of the laser beam in the focal plane 18 is 40W or 120 microns. (For the sake of clarity in FIG. 3, the widths of the laser beam falling on the sample 1 and passing through the plane 18 have not been drawn to scale.)

The mirrors 19 and 20 are rigidly mounted on a common mirror support 50 which is movable in the directions indicated by arrows 52. Movement of the mirrors 19 and 20 in the directions of arrows 52 permits a parallel shift of laser beam 2a without changing the length of the path the laser light travels from the laser 14 to the focal plane 18. However, by changing the position of support 50 and mirrors 19 and 20, the angle "gamma" at which laser beam 2a intersects the focal plane 18 may be changed. Thus, the angle "alpha" at which the laser beam 2a is incident on line 1 may be varied. In place of movable support 50 and mirrors 19 and 20, a rotating polygonal mirror or a galvanometer mirror located in the focal plane 18 could be used to vary the angle "alpha".

Figure 6:
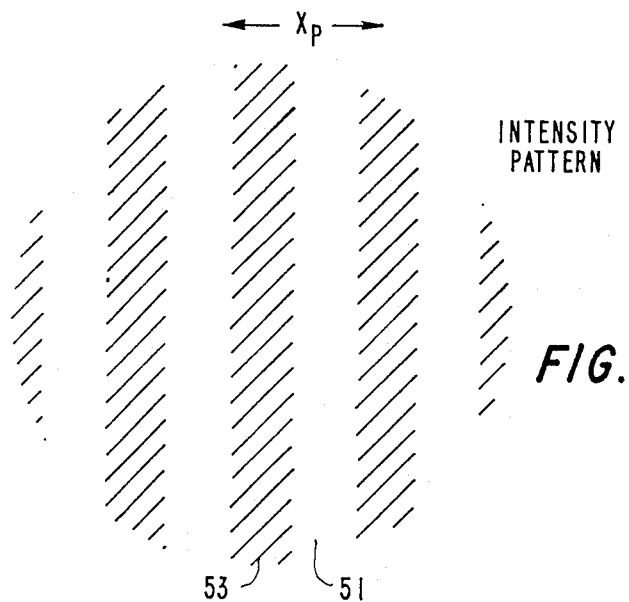
FIG. 6 illustrates an interference pattern produced by the apparatus of FIG. 3.

Electromagnetic energy scattered from sample 1, particularly the electromagnetic energy flowing in directions 5 and 6 which has been scattered by the edges of sample 1, is collected by the objective lens 9 and reflected by a second beam splitter 12. A spatial filter 21, which may be an optical stop in the form of an opaque strip running normal to the plane of FIG. 3, ideally blocks all back scattered electromagnetic energy except the back scattered electromagnetic energy flowing in directions 5 and 6. The electromagnetic energy beams flowing in directions 5 and 6 are combined in a focal plane 22. The resulting combined electromagnetic energy beam is magnified by lens 23, which may have a focal length of about 8 mm., and is projected onto a screen 24. The combination of electromagnetic energy beams flowing in directions 5 and 6 produces a periodic intensity distribution in space manifested as an interference pattern varying in the x-direction in plane 22 and on screen 24 between localized maxima 51 and localized minima 53, as shown schematically in FIGS. 3 and 4 at reference numeral 25. The interference pattern projected on the screen 24 is shown more clearly in FIG. 6 which shows a series of stripes representing the maxima 51 and the minima 53 in the interference pattern.

The distance, or spatial period, "$x_p$", between adjacent maxima, or between adjacent minima, in the interference pattern is related to the phase difference between the beams of electromagnetic energy flowing in directions 5 and 6 and corresponds to a path length difference between beams in directions 5 and 6 of one wavelength "lambda". The period "$x_p$" of the interference pattern can be determined directly from the intensity distribution on screen 24 by measuring the distance between adjacent intensity maxima or between adjacent intensity minima. The position "$x_s$" of a maximum in the interference pattern on the screen 24 is given by the following equation:

$$x_s = [(x_p/lambda) \times (p)] + (constant) \quad (4)$$

where "p" is the difference in path length of electromagnetic energy flowing in directions 5 and 6 because of the non-zero angle of incidence "alpha" of the electromagnetic energy impinging on line 1. The path length difference "p" is given by equation (1) for a line with sharp corners or by equation (2) for a line with rounded corners.

Combining equation (2) with equation (5) results in the following general equation $$x_s = [(x_p/lambda) \times F(a, alpha)] + (constant). \quad (5)$$

If the line being measured has relatively sharp corners as shown in FIG. 1, then the position of a maximum in the interference pattern is as follows:

$$x_s = \{(x_p/lambda) \times [a \sin(alpha)]\} + (constant). \quad (6)$$

Equations (5) and (6) can be considered to describe a shifting of the interference pattern, as represented by a change in the position "$x_s$" of any given intensity maximum in the interference pattern, when the angle of incidence "alpha" is varied. Alternatively, equations (5) and (6) can be considered to describe the change in "alpha" which is required to shift the interference pattern by a predetermined amount in the x-direction in image plane 22 or on screen 24. In principle, therefore, if the nature of F(a,alpha) is known, the line width "a" may be determined by measuring "$x_p$" and the change in "$x_s$" produced by a given change in the angle of incidence "alpha". For example, if F(a,alpha) is equal to "a sin(alpha)", as in FIG. 1 and as in equation (6), then measurement of "$x_p$" and the change in "$x_s$" for a predetermined change in "alpha" permits the line width "a" to be determined by solving equation (6) for "a". One way to solve equation (6) for "a" is to direct incident electromagnetic energy in accordance with this invention toward line 1 at two predetermined incidence angles "alpha" and then to measure "$x_s$" at those two angles of incidence. Plugging the two values of "alpha" and "$x_s$" into equation (6) results in two equations in two unknowns, "a" and the "constant", which then may be solved for "a" manually or by an electronic circuit such as a programmed computer, in both cases using standard algebraic procedures.

FIG. 4 shows an example of a detector for determining the relationship between changes in "alpha" and changes in the position of the interference pattern. As explained in more detail below, the detector may be calibrated by measuring lines of known width and observing the change of position of the interference pattern as the angle of incidence is varied. Lines having unknown widths may be measured and the shift in the interference pattern caused by the variation of the incidence angle produced by this measurement may be compared to those produced by the lines of known width to arrive at the unknown width. This may be done without having to know the nature of the function F(a,alpha). The detector of FIG. 4 may also be used in a technique which fits experimental curves to calculated curves.

The detector of FIG. 4 comprises a dual element photodetector 60, composed of two adjacent photosensitive elements 62 and 64, which may be a pair of silicon photodiodes. The dual element photodetector 60 is mounted to the screen 24 on which the interference pattern 25 is projected. Screen 24 is movable up or down, as indicated by arrows 55, to vary the position of the dual element photodetector 60. Each of the photosensitive elements 62 and 64 in the photodetector 60 produces an electrical output signal related to the intensity of electromagnetic energy falling on it. The difference in the magnitude of the output signals of elements 62 and 64 is zero when an intensity maximum, or an intensity minimum, of the interference pattern 25 is centered on the dual element photodetector 60, an equal amount of electromagnetic energy falling on the photosensitive elements 62 and 64 in this situation. The difference in magnitude of the output signals of elements 62 and 64 is positive or negative when an intensity maximum is on either side of the center of dual element photodetector 60 and there is no intensity minimum centered on the photodetector 60.

A phase-sensitive amplifier 26 having a difference input port 26a receives the output signals from the elements 62 and 64 and, as a frequency reference, a signal from a beam chopper 27 placed in the path of the light beam from laser 14, which periodically interrupts the light beam at a predetermined rate, for example, at a rate of about one kilohertz. One example of such a phase-sensitive amplifier that may be used is a Princeton Applied Research Model 128A. As is known in the art, this type of an arrangement is used to render the apparatus sensitive only to light produced by the laser and scattered from the object being measured, and not to other extraneous light sources such as ambient lighting. In other words, the amplifier is essentially a phase-locked loop which acts as a band pass filter with the frequency of the beam chopper falling in the pass band of the filter. Other types of known arrangements may be used which are capable of producing an output signal related to the difference in the outputs of the photosensitive elements 62 and 64.

In this example of the invention, the amplifier 26 produces an amplified signal related only to the difference between the magnitudes of the output signals from the elements 62 and 64 caused by exposure of those elements to the light produced by the laser. A servo motor 28 is connected to the output of the amplifier 26 and is responsive to the difference signal from that amplifier to drive the mirror support 50 and mirrors 19 and 20 up or down depending on the relative position of the interference pattern 25 and the dual element photodetector 60. Specifically, the difference amplifier 26 produces an output signal to drive mirror support 50 so as to change the angle of incidence "alpha" until the interference pattern 25 has shifted to maintain a selected intensity maximum centered on dual element photodetector 60.

Screen 24 and dual element photodetector 60 are moved to a plurality of positions, manually or in some automatic fashion, for example, by a controlled electric motor. For each position of the photodetector 60, the mirror support is automatically driven by the motor 28 to a corresponding position to change the angle of incidence "alpha" of the electromagnetic energy beam 2 until the interference pattern 25 has shifted in an amount to keep an intensity maximum centered on the dual element photodetector 60. Each position of the dual element photodetector 60 and the corresponding position of support 50 is recorded manually by directly reading their positions from suitable scales on the apparatus (not shown) or automatically by electronic position measuring instruments such as measuring styli (not shown) which store the position data on a plotter or in a computer.

Using equation (5), the magnitude of the function F(a,alpha) can be determined from the measured values of "$x_s$" and the corresponding positions of the support 50. For each of the positions of support 50, one can calculate the corresponding values of "alpha" by elementary geometrical techniques. An example of how equation (5) may be used to determine the magnitude of F(a,alpha) is as follows. First, the angle of incidence is set to zero and the interference pattern is observed. The location of the interference pattern in this case constitutes a reference position. Then, the angle of incidence is varied and, at each of a selected number of incidence angles, the shift of the interference pattern, or the change in "$x_s$", from the reference position is measured and recorded, manually or using known automatic measurement apparatus. The magnitude of F(a,alpha) may be computed from equation (5) by solving that equation for F(a,alpha) at each of the selected number of incidence angles. Specifically, it may be computed in light of the fact that the change in "$x_s$" equals "($x_p$/lambda)x-F(a,alpha)", which is a consequence of the relationship defined by equation (5). This results in an experimental function F(a,alpha). The experimental function F(a,alpha) and the theoretical functions F(a,alpha) computed for the assumed line shapes can then compared to find the line width as described above. Also as described above, this can be done manually or through the use of an automatic apparatus such as a programmed computer.

In addition to comparing experimental curves to theoretically determined curves as above, the experimental curves may be compared to experimentally determined calibration information. In other words, lines having known widths can be measured with the apparatus of FIGS. 3 and 4 to calibrate the apparatus for use in measuring lines of unknown width. To accomplish this calibration, the screen 24 and the attached dual element photodetector 60 are moved to a plurality of positions when a line of known width is being measured. In response to the movement of the screen 24 and the photodetector 60, the motor 28 moves the mirror support so that the dual element photodetector 60 tracks an intensity maximum as described above. The position of the mirrors as a function of photodetector position is recorded in any convenient fashion using known apparatus. This procedure is repeated for a number of lines having known widths to construct a set of calibration data comprising a group of curves relating mirror position to photodetector position. This group of curves is later used to ascertain the unknown widths of other lines which have been made using the same fabrication procedures used to make the lines of known width. To accomplish this, the procedure used to calibrate the apparatus is repeated for a line having an unknown width. Data of mirror position versus photodetector position for the line of unknown width is compared with the calibration data for the lines of known width to see which curve for the known lines comes the closest to the set of measurement data obtained for the unknown line. It may be inferred that the unknown width is the same as that of the line of known width which produces the closest fit between the calibration data for the known line and the measured data for the unknown line.

Figure 5:
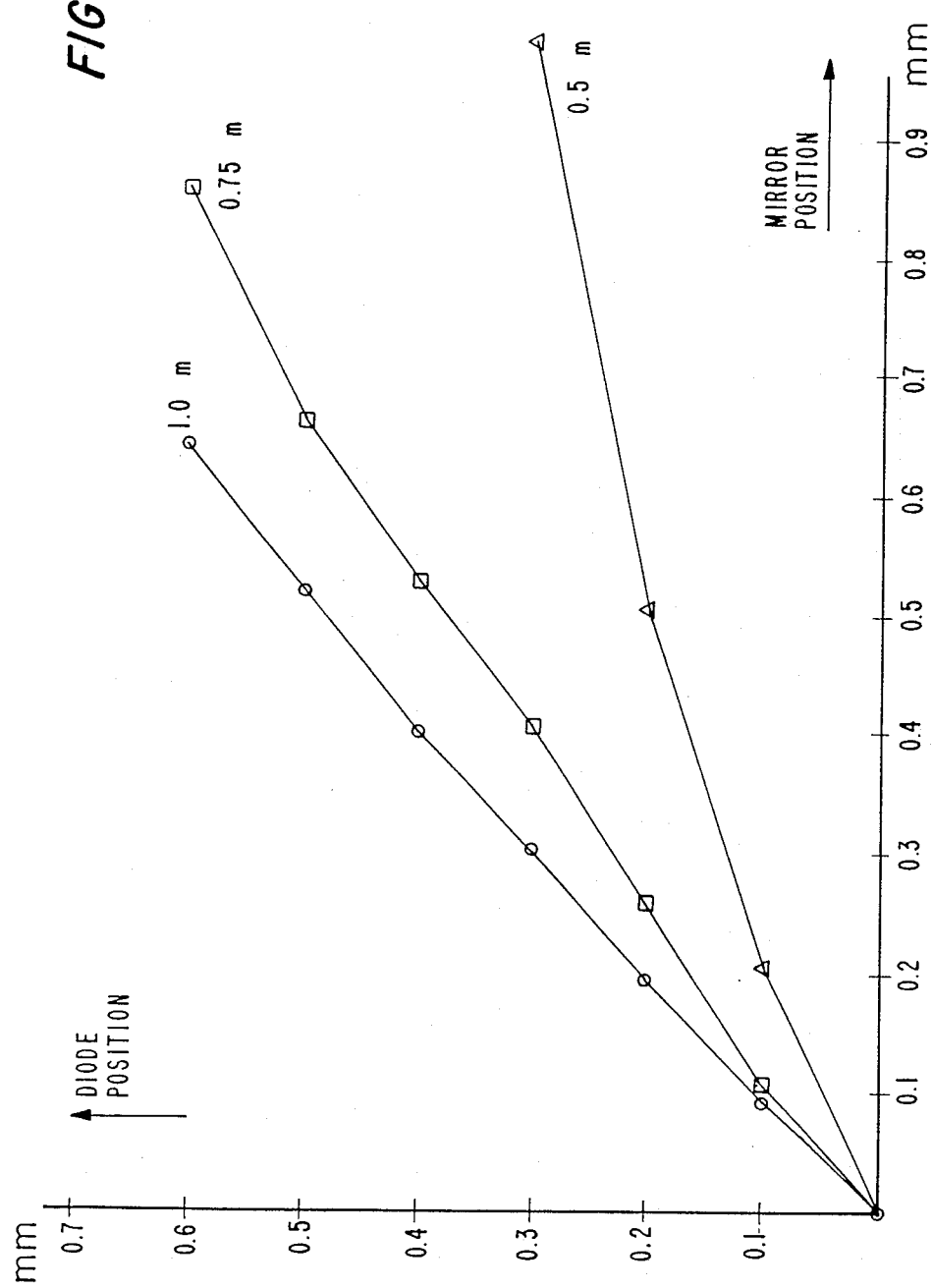
FIG. 5 is a graph illustrating an empirically determined relationship between detector position and mirror position for three values of line width, the apparatus of FIGS. 3 and 4 having been used to measure three lines of known width to determine the empirical relationship.

FIG. 5 shows a set of data obtained using the apparatus of FIGS. 3 and 4. That data comprises curves of photodetector position versus corresponding mirror position for three lines. The line widths identified in FIG. 5 are nominal values corresponding to that which would be expected in light of the procedures and equipment used to make the lines. In addition to merely inferring the line widths from the fabrication procedures, the precise values of the unknown line widths may be actually measured in any known manner, for example, those precise values may be determined using measurement procedures involving an electron microscope, which then would make it possible to use the information in FIG. 5 as calibration data. It is evident that there is a definite correspondence between the characteristics of the curves in FIG. 5 and the actual line widths. To a first approximation, the curves of FIG. 5 are straight lines having slopes related to the line widths. Lines having unknown widths can be subjected to the measurement procedures used to produce the data of FIG. 5. The resulting data will approximate straight lines having slopes related to line width. The slopes of the curves produced for the lines having unknown widths can be compared to the slopes of the curves for the lines having known widths to determine the magnitude of the unknown line widths or to determine how close the unknown width of any given line comes to the known width of one of the lines used to calibrate the measuring apparatus.

Figure 7:
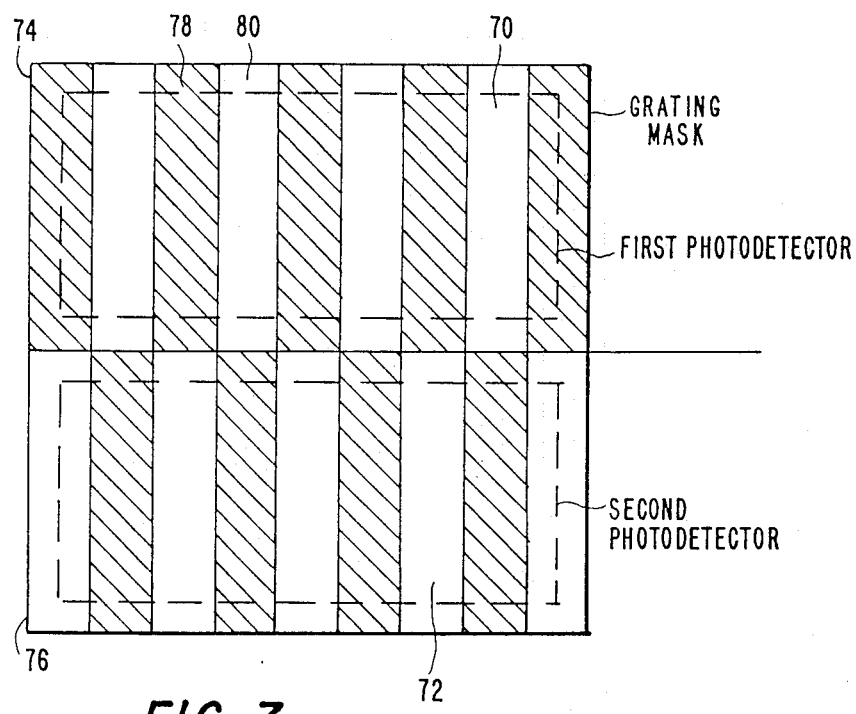
FIG. 7 shows a second example of a detector useful in carrying out the invention.

FIG. 7 shows a detector which could be used in place of the dual element photodetector 60 of FIG. 4. The detector consists of two large area electromagnetic energy detectors 70 and 72 mounted behind a pair of mask gratings 74 and 76. The masks gratings 74 and 76 may be any generally known chrome mask gratings consisting of a series of opaque stripes 78 alternating with a series of transparent stripes 80. The width of the stripes is such that the distance between the centers of the stripes is about the same as the spatial period "$x_p$" of the interference pattern 25. The opaque and transparent stripes of the masks are laterally offset from one another by half of a period "$x_p$" as shown in FIG. 7. Detectors 70 and 72 provide signals which correspond to the signals provided by elements 62 and 64 of the dual element photodetector 60. Circuitry similar to that of FIG. 4 may be used to track the movement of intensity maxima as the mirrors 19 and 20 are moved. As in the example of FIGS. 3 and 4, theoretical curve fitting techniques may be used to determine unknown line widths or calibration data may be taken and used to measure unknown line widths.

A stationary array of closely spaced photodiodes or charge coupled devices may also be used in place of dual element photodetector 60 of FIG. 4 to determine the change in the position of the interference pattern 25 produced by a change in the position of the mirror support and a change in the incidence angle "alpha". In this situation, the pixel repetition distance of the photodiode array or the charge coupled device array must be substantially smaller than the spatial period "$x_p$" of interference pattern 25. The shift in the position of the interference pattern as the angle of incidence "alpha" is changed may be determined by a microprocessor or any other known image processing circuitry in response to the output signals from the photodiodes or charge coupled devices. The use of such an array would have the advantage of not requiring moving mechanical parts to position the array.

Also, the collection and combination of the electromagnetic energy scattered in directions 5 and 6 does not have to be accomplished by a single objective lens such as the objective lens 9 in FIG. 3. Two smaller objective lenses arranged with respect to the line being measured so that they collect the desired scattered electromagnetic energy may be used in addition to the objective lens 9. Specifically, those lenses may be used to collect the beams of electromagnetic energy in directions corresponding to directions 5 and 6 in FIG. 3. Suitable mirrors, lenses, and beam splitters may be used to combine the electromagnetic energy flowing in directions 5 and 6 to produce an interference pattern which is useful in determining the width of the line under consideration.

Figure 8:
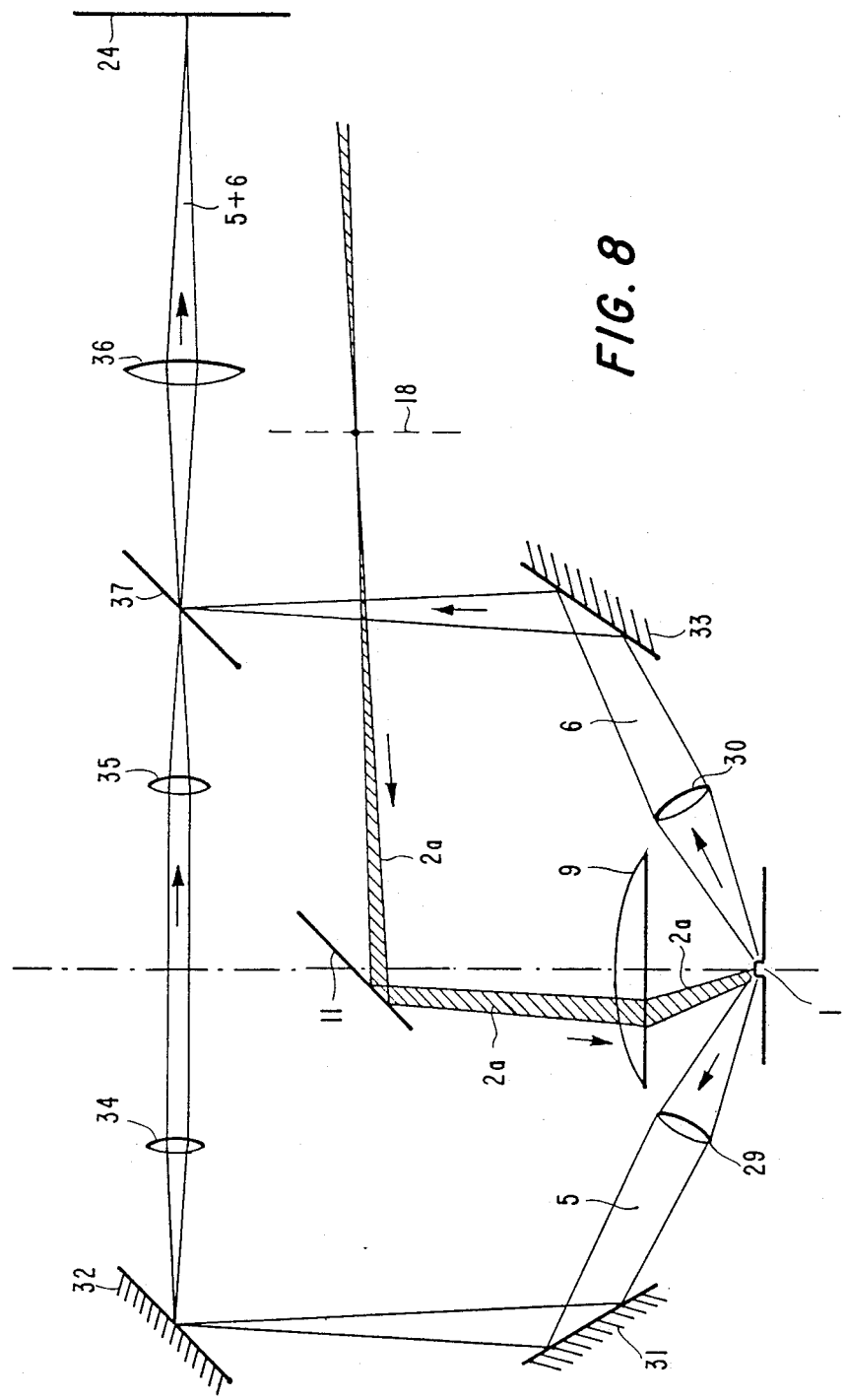
FIG. 8 is a schematic diagram of a second example of an optical measurement system in accordance with the invention of this application.

FIG. 8 shows the salient features of an example of such a multiple objective lens system which may be used in place of the system having a single objective lens 9 in FIG. 3. As shown in FIG. 8, an incident electromagnetic energy beam 2a passes through a focal plane 18 and is reflected by beam splitter 11 toward an objective lens 9. The objective lens 9 directs the incident electromagnetic energy beam 2a toward a line 1 which is to be measured. Electromagnetic energy is scattered in directions 5 and 6 by the edges of line 1 in a manner similar to that of FIGS. 1-3 as described above. Scattered electromagnetic energy flowing in direction 5 is collected by small apertured objective lens 29 and directed by mirrors 31 and 32 and lenses 34 and 35 to a beam splitter 37. Scattered electromagnetic energy flowing in direction 6 is collected by small apertured objective lens 30 and directed by a mirror 33 to the beam splitter 37 where it is combined with the electromagnetic energy flowing in direction 5. The scattered electromagnetic energy combined by beam splitter 37 is then magnified by a lens 36 and projected onto a screen 24. It is noteworthy that the spatial filter 21 of FIG. 3 is not necessary in the apparatus of FIG. 8 since the apertures of the objective lenses 29 and 30 may be selected to be small enough so that the lenses 29 and 30 act as spatial filters. The interference pattern appearing on screen 24 in FIG. 8 is a pattern of concentric rings and can be evaluated in the same manner as the striped interference pattern of FIGS. 3, 4, and 6 to determine the width of line 1.

We claim:

1. An apparatus for measuring a dimension of an object having first and second points which define the dimension, comprising:
   a means for directing a beam of electromagnetic energy toward the object at a predetermined angle of incidence so that electromagnetic energy is scattered from the first and second points; and
   a means for detecting the electromagnetic energy scattered from the first and second points so that the dimension may be measured, in which the means for detecting the electromagnetic energy comprises:
   a means for combining the electromagnetic energy scattered from the first and second points to form at a predetermined location an interference pattern having an intensity which varies periodically in space between localized maxima and minima, the characteristics of the pattern being a function of the angle of incidence of the beam of electromagnetic energy and the dimension of the object; and
   a means for observing the intensity of a predetermined portion of the interference pattern.

2. The apparatus of claim 1, in which the means for directing comprises:
   a means for varying the angle of incidence of the beam of electromagnetic energy and the position of the interference pattern.

3. The apparatus of claim 1, in which the means for detecting comprises:
   a means for combining the electromagnetic energy scattered from the first and second points to form at a detector plane an interference pattern having an intensity which varies periodically in the detector plane between localized maxima and minima, the position of the pattern being determined by the angle of incidence of the beam of electromagnetic energy and the dimension of the object; and
   a means for observing the position of the interference pattern in the detector plane.

4. The apparatus of claim 3, in which the means for directing comprises:
   a means for varying the angle of incidence of the beam of electromagnetic energy and the position of the interference pattern.

5. The apparatus of claim 4, in which the means for observing the position of the interference pattern comprises:
   a pair of photosensitive elements for measuring the intensities of the interference pattern at predetermined locations in the detector plane; and
   a means for producing a difference signal related to the difference in intensities measured by the photosensitive elements.

6. The apparatus of claim 5, in which the means for observing the position of the interference pattern comprises:
   a means responsive to the difference signal for varying the angle of incidence of the beam of electromagnetic energy and the position of the interference pattern so as to reduce the magnitude of the difference signal.

7. The apparatus of claim 1, further comprising a means for calibrating the measuring apparatus by determining the function of interference pattern characteristics versus angle of incidence and object dimension.

8. The apparatus of claim 7, in which the calibrating means comprises:
   a means for observing objects having known dimensions; and
   a means for deriving a set of calibration data in response to observation of the objects having known dimensions.

9. The apparatus of claim 8, further comprising:
   a means for deriving measurement data for an object having an unknown dimension; and
   a means for comparing the measurement data with the calibration data to ascertain the magnitude of the unknown dimension.

10. The apparatus of claim 1, in which the beam of electromagnetic energy is a plane wave of predetermined dimensions.

11. The apparatus of claim 10, in which the predetermined dimensions are such that the plane wave is incident upon only a single object.

12. The apparatus of claim 1, in which the means for combining is such that the electromagnetic energy scattered from the first point travels along a path having a length different from the length of a path along which the electromagnetic energy scattered from the second point travels, there being a relationship between the path length difference of the electromagnetic energy scattered from the first and second points, the angle of incidence, and the dimension to be measured, the apparatus further comprising:
- a means for ascertaining the relationship between the path length difference of the electromagnetic energy scattered from the first and second points, the angle of incidence, and the dimension to be measured for one or more possible shapes of an object to be measured;
- a means for taking predetermined measurements of an actual object and comparing the measurements with the relationships determined by the means for ascertaining; and
- a means responsive to the comparing means for determining the dimension of the actual object.

13. The apparatus of claim 1, in which the dimension is the width of the object.

14. The apparatus of claim 13, in which the dimension is the width of a line of material disposed on a substrate.

15. An apparatus for determining a dimension of one of a number of objects disposed on a substrate, comprising:
- a means for producing a beam of monochromatic incident electromagnetic energy;
- a means for directing the beam of electromagnetic energy toward the one object at a predetermined incidence angle;
- a means for shaping the beam of incident electromagnetic energy so that it is substantially a plane wave impinging on no more than the one object on the substrate;
- a means for producing in a detection plane an interference pattern comprising electromagnetic energy having an intensity which varies periodically between localized maxima and minima, the interference pattern having been produced in response to electromagnetic energy scattered from two points which define the dimension to be determined;
- a means for detecting the intensity of electromagnetic energy located with respect to the interference pattern so that it is responsive to a predetermined part of the interference pattern;
- a means for moving the detecting means with respect to the interference pattern; and
- a means responsive to movement of the detecting means for changing the angle of incidence so that the detecting means continues to be responsive to the predetermined part of the interference pattern.

16. The apparatus of claim 15, in which the means for producing a monochromatic beam of electromagnetic energy comprises a laser.

17. The apparatus of claim 15, in which the shaping means comprises one or more lenses in the beam of electromagnetic energy for controlling the dimensions of the beam of electromagnetic energy.

18. The apparatus of claim 15, in which the means for directing the beam of electromagnetic energy toward the one object and the means for producing an interference pattern comprise an objective lens for focusing the beam of electromagnetic onto the one object and for focusing electromagnetic energy scattered from the two points of the one object onto a focal plane.

19. The apparatus of claim 15, in which the means for directing the beam of electromagnetic energy toward the one object comprises an objective lens for focusing the beam of electromagnetic energy onto the one object.

20. The apparatus of claim 19, in which the means for producing an interference pattern comprises an objective lens for focusing electromagnetic energy scattered from one of the two points on the one object onto a focal plane and another objective lens for focusing electromagnetic energy scattered from the other of the two points on the one object onto the focal plane.

21. The apparatus of claim 15, in which the means for producing an interference pattern comprises an objective lens for focusing electromagnetic energy scattered from the two points of the one object onto a focal plane.

22. The apparatus of claim 15, in which the means for detecting comprises a first photosensitive element located in a detector plane for producing an output signal in response to electromagnetic energy falling on the first photosensitive element, a second photosensitive element located in the detector plane for producing a second output signal in response to electromagnetic energy falling on the second photosensitive element, and a means for producing a signal related to the difference in the outputs of the first and second photosensitive elements.

23. The apparatus of claim 22, in which the means for changing the angle of incidence is responsive to the difference signal producing means.

24. The apparatus of claim 15, in which the means for detecting comprises an array of photodiodes.

25. The apparatus of claim 15, in which the means for detecting comprises an array of charge coupled devices.

26. A method of measuring a dimension of an object having first and second points which define the dimension, comprising the steps of:
- directing a beam of electromagnetic energy toward the object at a predetermined angle of incidence so that electromagnetic energy is scattered from the first and second points; and
- detecting the electromagnetic energy scattered from the first and second points so that the dimension may be measured, in which the step of detecting electromagnetic energy comprises the steps of:
- combining the electromagnetic energy scattered from the first and second points to form at a predetermined location an interference pattern having an intensity which varies periodically in space between localized maxima and minima, the characteristics of the pattern being a function of the angle of incidence of the beam of electromagnetic energy and the dimension of the object; and
- observing the intensity of a predetermined portion of the interference pattern.

27. The method of claim 26, in which the step of directing comprises the step of:
- varying the angle of incidence of the beam of electromagnetic energy and the position of the interference pattern.

28. The method of claim 26, in which the step of detecting comprises the steps of:
- combining the electromagnetic energy scattered from the first and second points to form at a detector plane an interference pattern having an intensity which varies periodically in the detector plane between localized maxima and minima, the position of the pattern being determined by the angle of incidence of the beam of electromagnetic energy and the dimension of the object; and observing the intensity of a predetermined portion of the interference pattern.

29. The method of claim 28, in which the step of directing comprises the step of:
varying the angle of incidence of the beam of electromagnetic energy and the position of the interference pattern.

30. The method of claim 29, in which the observing step comprises the steps of:
measuring the intensities of the interference pattern at predetermined locations in the detector plane with a pair of photosensitive elements; and
producing a difference signal related to the difference in intensities measured by the photosensitive elements.

31. The method of claim 30, in which the varying step comprises the step of:
varying the angle of incidence of the beam of electromagnetic energy and the position of the interference pattern so as to reduce the magnitude of the difference signal.

32. The method of claim 26, further comprising the step of calibrating the apparatus used to measure the dimension of the object by determining the function of interference pattern characteristics versus angle of incidence and object dimension.

33. The method of claim 32, in which the calibrating step comprises the steps of:
observing objects having known dimensions; and
deriving a set of calibration data in response to observation of the objects having known dimensions.

34. The method of claim 33, further comprising the steps of:
deriving measurement data for an object having an unknown dimension; and
comparing the measurement data with the calibration data to ascertain the magnitude of the unknown dimension.

35. The method of claim 26, in which the beam of electromagnetic energy is a plane wave of predetermined dimensions.

36. The method of claim 35, in which the predetermined dimensions are such that the plane wave is incident upon only a single object.

37. The method of claim 26, in which the step of combining is such that electromagnetic energy scattered from the first point travels along a path having a length different from the length of a path along which the electromagnetic energy scattered from the second point travels, there being a relationship between the path length difference of the electromagnetic energy scattered from the first and second points, the angle of incidence, and the dimension to be measured for the shape of an object to be measured, the method further comprising the steps of:
ascertaining the relationship between the path length difference of the electromagnetic energy scattered from the first and second points, the angle of incidence, and the dimension to be measured for one or more possible shapes of an object to be measured;
taking predetermined measurements of an actual object and comparing the measurements with the relationships determined in the ascertaining step; and
determining the dimension of the actual object in light of the results of the comparing step.

38. The method of claim 26, in which the dimension is the width of the object.

39. The method of claim 38, in which the dimension is the width of a line of material disposed on a substrate.

40. A method of determining a dimension of one of a number of objects disposed on a substrate, comprising the steps of:
producing a beam of monochromatic incident electromagnetic energy;
directing the beam of electromagnetic energy toward the one object at a predetermined incidence angle;
shaping the beam of incident electromagnetic energy so that it is substantially a plane wave impinging on no more than the one object on the substrate;
producing in a detection plane an interference pattern comprising electromagnetic energy having an intensity which varies periodically between localized maxima and minima, the interference pattern having been produced in response to electromagnetic energy scattered from two points which define the dimension to be determined;
detecting the intensity of electromagnetic energy of a predetermined part of the interference pattern with a detecting means located with respect to the interference pattern so that it is responsive to the predetermined part of the interference pattern;
moving the detecting means with respect to the interference pattern; and
changing the angle of incidence in response to movement of the detecting means so that the detecting means continues to be responsive to the predetermined part of the interference pattern.

41. The method of claim 40, in which the step of producing a monochromatic beam of electromagnetic energy comprises producing a beam of electromagnetic energy with a laser.

42. The method of claim 40, in which the shaping step comprises the step of shaping the beam of incident electromagnetic energy with one or more lenses placed in the beam of electromagnetic energy for controlling the dimensions of the beam of electromagnetic energy.

43. The method of claim 40, in which the step of directing the beam of electromagnetic energy toward the one object and the step of producing an interference pattern comprise the use of an objective lens for focusing the beam of electromagnetic onto the one object and for focusing electromagnetic energy scattered from the two points of the one object onto a focal plane.

44. The method of claim 40, in which the step of directing the beam of electromagnetic energy toward the one object comprises the use of an objective lens for focusing the beam of electromagnetic energy onto the one object.

45. The method of claim 44, in which the step of producing an interference pattern comprises the use of an objective lens for focusing electromagnetic energy scattered from one of the two points on the one object onto a focal plane and another objective lens for focusing electromagnetic energy from the other of the two points on the one object onto the focal plane.

46. The method of claim 40, in which the step of producing an interference pattern comprises the use of an objective lens for focusing electromagnetic energy scattered from the two points of the one object onto a focal plane.

47. The method of claim 40, in which the step of detecting comprises the steps of using a first photosensitive element located in a detector plane for producing an output signal in response to electromagnetic energy falling on the first photosensitive element, using a second photosensitive element located in the detector plane for producing a second output signal in response to electromagnetic energy falling on the second photosensitive element, and using a means for producing a signal related to the difference in the outputs of the first and second photosensitive elements.

48. The method of claim 47, in which the step of changing the angle of incidence is responsive to the results of the step of using a means for producing a difference signal.

49. The method of claim 40, in which the step of detecting comprises the use of an array of photodiodes.

50. The method of claim 40, in which the step of detecting comprises the use of an array of charge coupled devices.

51. An apparatus for measuring a dimension of an object having first and second points which define the dimension, comprising:
   a means for directing a beam of electromagnetic energy having a predetermined wavelength, "lambda", toward the object at a predetermined angle of incidence "alpha" so that the beam of electromagnetic energy is scattered from the first and second points;
   a means for combining the electromagnetic energy scattered from the first and second points to form in a detector plane an interference pattern having an intensity which varies periodically between localized maxima and minima, the position of the pattern in the plane being determined by the angle of incidence of the beam of electromagnetic energy and the dimension of the object; and
   a means for observing at least one characteristic of the interference pattern to determine the magnitude of the dimension.

52. The apparatus of claim 51, further comprising:
   a means for detecting the intensity of the electromagnetic energy in the interference pattern at a plurality of predetermined locations, "$x_s$", in the detector plane; and
   a means for determining for each predetermined location, "$x_s$", the angle of incidence, "alpha", required to produce a preselected detected intensity.

53. The apparatus of claim 52, further comprising:
   a means for determining the spatial period, "$x_p$", of the interference pattern; and
   a means for determining the dimension of the object from the relationship:

$$x_s = [(x_p/lambda) \times F(a, alpha)] + (constant)$$

based on determined values for "lambda", "$x_s$", "alpha", and "$x_p$", where "a" is the dimension to be determined and "F(a,alpha)" is the relationship between the dimension to be determined, the angle of incidence, and the difference in path length traveled by the electromagnetic energy scattered from the first and second points.

54. A method of measuring a dimension of an object having first and second points which define the dimension, comprising the steps of:
   directing a beam of electromagnetic energy having a predetermined wavelength, "lambda", toward the object at a predetermined angle of incidence "alpha" so that the beam of electromagnetic energy is scattered from the first and second points;
   combining the electromagnetic energy scattered from the first and second points to form in a detector plane an interference pattern having an intensity which varies periodically between localized maxima and minima, the position of the pattern in the plane being determined by the angle of incidence of the beam of electromagnetic energy and the dimension of the object; and
   observing at least one characteristic of the interference pattern to determine the magnitude of the dimension.

55. The method of claim 54, further comprising the steps of:
   detecting the intensity of the electromagnetic energy in the interference pattern at a plurality of predetermined locations, "$x_s$", in the detector plane; and
   determining for each predetermined location, "$x_s$", the angle of incidence, "alpha", required to produce a preselected detected intensity.

56. The method of claim 55, further comprising the steps of:
   determining the spatial period, "$x_p$", of the interference pattern; and
   determining the dimension of the object from the relationship:

$$x_x = [(x_p/lambda) \times F(a, alpha)] + (constant)$$

based on determined values for "lambda", "$x_s$", "alpha", and "$x_p$", where "a" is the dimension to be determined and "F(a,alpha)" is the relationship between the dimension to be determined, the angle of incidence, and the difference in path length traveled by the electromagnetic energy scattered from the first and second points.

* * * * *